May 2, 1967 JAMES E. WEBB 3,317,797

ADMINISTRATOR OF THE NATIONAL AERONAUTICS AND SPACE ADMINISTRATION

MICROELECTRONIC MODULE PACKAGE

Filed Dec. 23, 1965

Albert L. Johnson, Jr.
INVENTOR.

BY [signature]
[signature]
ATTORNEYS

United States Patent Office 3,317,797 Patented May 2, 1967

3,317,797

MICROELECTRONIC MODULE PACKAGE

James E. Webb, Administrator of the National Aeronautics and Space Administration, with respect to an invention of Albert L. Johnson, Jr., New Brighton, Minn.

Filed Dec. 23, 1965, Ser. No. 516,153
2 Claims. (Cl. 317—100)

The invention relates in general to microelectronic packaging and, more particularly, to electrical connections for thin film hybrid microcircuits.

The removal of internally generated heat from electronic packages is one of the foremost problems facing the designers of such equipment. The problem is further intensified by demands for improved reliability, miniaturization, use of potted and sealed units, and higher operating temperatures. By taking advantage of available conductive cooling, employing high temperature components when possible, and ensuring thermal isolation of temperature-sensitive components from high emitting sources, certain of these thermal problems may be overcome.

Further, approximately 20 percent of component failures are attributable to shock and vibration. Although this problem is not particularly serious for ground equipment, it can be serious in shipboard, aircraft, or missile equipment. Shock loading of components may range from a few *g*'s encountered during transport to values approaching 50 *g*'s which may be encountered in missile equipment.

One type of miniaturized circuit presently being used, where increased reliability and reduced size and weight are important factors such as in military and space oriented electronic systems, is the thin film hybrid microcircuit. Further, because of its design flexibility, the thin film hybrid microcircuit can be used in many applications to replace existing electronic functions constructed by standard techniques such as welded modules, printed circuit assemblies, and the like. Moreover, these circuits are especially suited to analog applications where integrated circuitry is not available to perform the function.

Because of their inherent small size, thin film hybrid microcircuits must dissipate the same heat as their discrete component counterparts. Further, complex circuitry often requires more than one thin film hybrid microcircuit to be used to perform the required circuit function so that interconnections between two circuits are often difficult to make in one module.

Heretofore, one prior art technique for packaging thin film hybrid microcircuits has been the use of a "micromodule" wherein the microcircuits are stacked with electrical connections made by riser wires, wherein module attachment is normally accomplished by its leads. The major limitations of the "micromodule" lies in its inability to dissipate much heat and the fact that leads can be brought out only from two of its faces.

Another technique for packing thin film hybrid microcircuits is by the use of a "flatpack" wherein the module is also normally attached only by its leads. Further, the "flatpack" is limited by allowing for only one microcircuit internally and, therefore, interconnections between two thin film circuits take a larger number of external connections.

In order to overcome the disadvantages of prior art packaging techniques and further provide a reliable packaging technique for thin hybrid microcircuits, the present invention provides a rigid mechanical support with good thermal dissipation properties. Further, the invention allows two thin film circuits to be interconnected in one module with a minimum number of leads.

More particularly, the microelectronic module package comprises a metal heat sink which forms the structural member thereof. The heat sink has two of its opposite edges bent at right angles at the main portion thereof which is used to mount the module package into a larger assembly. The other two opposite edges have formed therein a lead wire block which is secured to the heat sink. On both surfaces of the heat sink a substrate, such as glass, is secured, upon which the electrical circuits are deposited. T-shaped electrical connectors are potted to the lead wire block. The ends of the cross member of the T have an electrical lead welded thereto, the other end of the leads being welded to the electrical circuit on the substrate. The longitudinal member of the T-shaped connectors may be connected to external electrical circuits.

The advantages of this invention, both as to its construction and mode of operation, will be readily appreciated as the same become better understood by reference to the following detailed description when considered in connection with the accompanying drawing in which like reference numerals designate like parts throughout the figures, and wherein.

Figure 1:
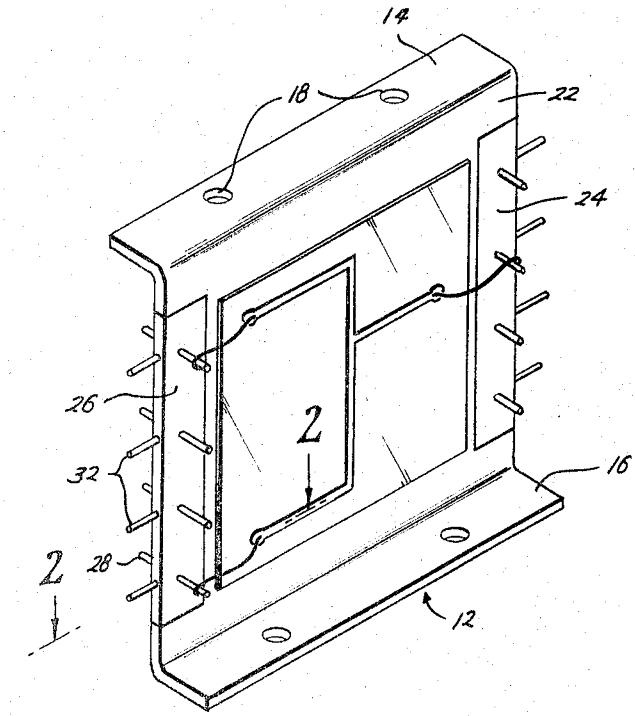
FIG. 1 is a perspective view of the microelectronic module package in accordance with this invention.

Referring now to the drawings, there is shown in FIG. 1 the microelectronic package in accordance with the invention. The main structure of the module package 12 is generally rectangular shaped with flanges 14, 16 at the upper and lower extremities extending in opposite directions to provide a generally Z-shape cross section. A plurality of holes 18 are drilled in each of the flanges so as to provide mounting means for the module package.

The main body of the package is formed of a metallic heat sink 22 and has a substrate attached to both sides of its surfaces. Contained along the two edges of the heat sink interconnecting the two flanges are lead wire blocks 24, 26 having cross-member connector 28 and external connector 32 mounted therein. These connectors are used for connecting the package to external circuitry. The lead wire blocks 24, 26 are typically cast or molded of epoxy. The connectors 28 and 32 are then cemented into position in slots provided in the epoxy block. The lead wire block assembly is then cemented to the heat sink 22 with epoxy cement. Alternatively, the connectors 28, 32 may be molded in place to the heat sink with epoxy or other suitable molding compound.

Figure 2:
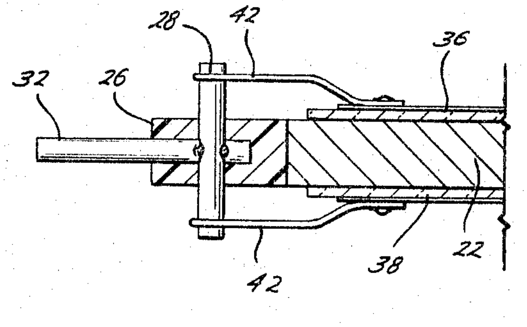
FIG. 2 is a cross-sectional view of the microelectronic module package FIG. 1 taken along the line 2—2 of FIG. 1.

Referring now to FIG. 2, the microelectronic module package is depicted in cross-sectional view. The heat sink 22 has attached thereto on either side thereof substrates 36, 38 normally formed of an inert material, such as glass, upon which electrical circuits are normally deposited. The lead wire block 24, which is bonded directly to the heat sink, has embodied therein the T-shaped electrical connector formed of a cross member connector 28 and an external connector 32. The external connector and cross member connector are normally gold plated nickel and are welded at their junction. Electrical leads 42 are welded between the ends of the cross member connector and the electrical circuit on the substrate. Thus, the cross member connectors can be used to directly join circuits mounted on both substrates. The external connector allows the circuits to be joined to external circuitry. If no external circuitry is needed, the external connector 32 can be cut off or otherwise removed.

Figure 3:
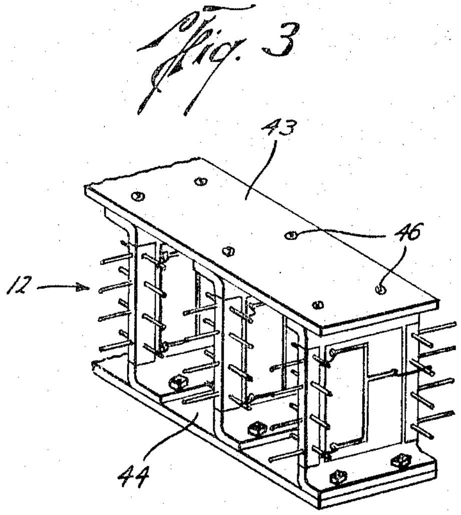
FIG. 3 is a perspective view of a module installation.

Referring now to FIG. 3, there is shown a module installation for mounting a plurality of electronic module packages as has been previously described. A pair of parallel support plates 43, 44 having holes 46 drilled along the upper and lower periphery thereof are used to secure the flanges of the module packages thereto. The holes 46 are matched to the flange holes 18, and, as can be readily seen, the heat sink of the module package itself is used to structurally attach the package and the electrical connectors need not be used to provide structural connections.

Thus, as can be readily seen, the electrical connections may be made from all four sides of the module package, rather than two ends as has been previously done, while simultaneously the external leads are not utilized for structural purposes. The heat sink provides efficient and effective heat removal from the module package.

It should be further understood that the foregoing disclosure relates only to preferred embodiments of the invention, and that it is intended to cover all changes and modifications of the examples of the invention herein chosen for the purpose of the disclosure which do not constitute departures from the spirit and scope of the invention.

What is claimed and desired to be secured by Letters Patent is:

1. A microelectronic module package adapted to be mounted between a first structural member and a second structural member comprising:

(a) a heat sink formed of a flat plate member having a first side and a second side, said flat plate member having a central section, a first end flange section, and a second end flange section, said central section having first and second opposite end portions and third and fourth opposite end portions, said first end flange section and said second end flange section being integral with said first and second opposite end portions, respectively, and perpendicular to said central section;

(b) means for securing said first end flange section and said second end flange section to said first structural member and said second structural member, respectively;

(c) means for mounting electrical connectors at said central section comprising lead wire blocks flush mounted to said heat sink at said third and fourth end portions;

(d) a first series of connectors mounted in said wire blocks and extending perpendicular to said heat sink central section and outwardly from said wire blocks;

(e) a second series of connectors extending outwardly from said wire block and perpendicular to said first series of connectors;

(f) a substrate of electrically non-conducted material superimposed on at least one of said heat sink sides;

(g) an electrical circuit positioned on at least one of said heat sink sides; and (h) means for coupling said electrical circuit to said series of connectors.

2. A microelectronic module package in accordance with claim 1 and further comprising a second substrate of electrical non-conductive material superimposed on said other of said heat sink sides and having an electrical circuit position thereon.

References Cited by the Examiner

UNITED STATES PATENTS

| | | | |
|---|---|---|---|
| 3,243,660 | 3/1966 | Yuska et al. | 317—100 |
| 3,259,806 | 7/1966 | Reed | 317—101 |

References Cited by the Applicant

UNITED STATES PATENTS

| | | |
|---|---|---|
| 2,019,625 | 11/1935 | O'Brien. |
| 2,590,821 | 3/1952 | Kiser. |
| 2,911,572 | 11/1959 | Francis et al. |
| 2,913,634 | 11/1959 | Scoville. |
| 2,935,654 | 5/1960 | Gittens et al. |
| 3,029,495 | 4/1962 | Doctor. |

ROBERT K. SCHAEFER, *Primary Examiner.*

M. GINSBURG, *Assistant Examiner.*